(12) United States Patent
Kim

(10) Patent No.: US 6,866,745 B2
(45) Date of Patent: Mar. 15, 2005

(54) SEMICONDUCTOR MANUFACTURING APPARATUS

(75) Inventor: Jung-Sik Kim, Choongcheongnam-do (KR)

(73) Assignee: Jusung Engineering Co. Ltd. (KR)

( * ) Notice: Subject to any disclaimer, the term of this patent is extended or adjusted under 35 U.S.C. 154(b) by 257 days.

(21) Appl. No.: 10/243,166

(22) Filed: Sep. 13, 2002

(65) Prior Publication Data

US 2003/0054657 A1 Mar. 20, 2003

(30) Foreign Application Priority Data

Sep. 18, 2001 (KR) .......................................... 2001-57482

(51) Int. Cl.[7] .......................... H05H 1/00; C23C 16/00
(52) U.S. Cl. .................................... 156/345.24; 118/712
(58) Field of Search ..................... 156/345.24, 345.25; 118/712, 715

(56) References Cited

U.S. PATENT DOCUMENTS 5,277,746 A * 1/1994 Anderson ..................... 117/55
5,331,171 A * 7/1994 Bongi ....................... 250/461.1
2002/0014203 A1 * 2/2002 Kim et al. ................... 118/713

OTHER PUBLICATIONS

IBM Technical Disclosure Bulletin, Jan. 1979, US vol. No. 21, Issue No. 8, pp. 3279–3280.*

* cited by examiner

Primary Examiner—Parviz Hassanzadeh
(74) Attorney, Agent, or Firm—Duane Morris LLP

(57) ABSTRACT

The present invention provides an observation device installed in a chamber that is used for manufacturing semiconductor devices. The observation device includes at least two light-emission sources located at a chamber wall of the chamber, an electric power supplier supplying electric power to the light-emission sources, and a viewer port which is also installed in the chamber wall. The light-emission sources correspond in position to each other in the chamber wall, and emit light downward. The viewer port includes a quartz window so that when the light-emission sources light up the inside of the chamber, an observer can observe a wafer and the chamber inside through the viewer port.

17 Claims, 6 Drawing Sheets

SEMICONDUCTOR MANUFACTURING APPARATUS

This application claims the benefit of Korean Patent Application No. 2001-57482 filed on Sep. 18, 2001, in Korea, which are both hereby incorporated by reference.

BACKGROUND OF THE INVENTION

1. Field of the Invention

The present invention relates to an apparatus of forming semiconductor devices, and more particularly, to a chamber in which an observation device is installed so as to observe and inspect a wafer and a processing state.

2. Description of Related Art

The semiconductor devices, such as a LSI (Large Scale Integrated), a memory IC (Integrated Circuit) and other logic elements, are generally fabricated by repeated depositing and patterning processes. Fabricating the semiconductor devices widely includes epitaxy process, thin film deposition process, diffusion/ion-injection process, photolithography, etching process, and so on. Among these fabrication processes, the thin film deposition process and the etching process are prerequisite for the semiconductor devices. Especially, these deposition and etching processes are performed in a processing chamber module having airtight reaction rooms.

The processing chamber module has variable configurations and structures depending on a process of designation. When the etching and patterning processes are required for the thin film deposited on the wafer, a plasma etcher (often referred to as a plasma processing chamber module) is utilized.

FIG. 1 schematically illustrates a processing chamber module diagram according to a conventional art. The processing chamber module 10 includes a chamber 20 which is airtight and inside which a thin film is formed, etched, patterned and so on. The processing chamber module 10 also includes a storage 40 that contains source materials and chemical reactants for supplying them into the chamber 20 during the designated process.

Inside the chamber 20, a wafer 1 is mounted on a chuck 30 (e.g., an electrostatic chuck). The chamber 20 includes an inflow pipe 23 through which the source materials and chemical reactants contained in the storage 40 is supplied, and an outflow pipe 24 through which residual gases are exhausted to control the pressure of the chamber 20. An insulating plate 26 is located in an upper part of the chamber 20 and divides the chamber 20 into a first region 28a and a second region 28b. In the first region 28a, a plasma generator 50 is installed to produce the plasma in the second region 28b. The chuck 30 on which the wafer 1 is laid is located in the second region 28b.

When the source materials and chemical reactants are streamed into the chamber 20 from the storage 40 via the inflow pipe 23, the plasma generator 50 generates an electromagnetic field and makes plasma in the second region 28b. Therefore, the thin film formed on the wafer 1 is etched and patterned using the plasma. Connected to the chuck 30 is a power source 60 for supplying power to attract the wafer 1 to the chuck 30 and for applying a bias voltage to the chuck 30.

When processing the semiconductor devices in the above-mentioned processing chamber module 10, the inside of the chamber 20 is isolated from the outside in order to obtain a stable processing progress. Also, the processing parameters in the chamber 20, such as pressure and temperature, are controlled different from the outside atmosphere. Namely, the inside surroundings of the chamber 20 has a distinguishable reaction system differentiating from the outside. For this reason, the chamber 20 is usually made of a metallic material including stainless steel that is relatively cheaper. However, since the metallic material for the chamber 20 is opaque, it is impossible to observe and inspect the wafer processes. This phenomenon is not limited only in the plasma processing chamber module for etching and patterning. If such a process chamber module made of an opaque metallic material is used in other processes, e.g., deposition process and cleaning process, non-observation and non-inspection are definitely expected during the processing of wafer.

Moreover, during the process for the semiconductor devices, a high air-purity is essential throughout the manufacturing field in order to protect the semiconductor devices from impurity contamination. To obtain the high purity, the personnel of the factory and the staffs are controlled and restricted to enter the manufacturing field. Therefore, it is quite difficult to detect the process errors and the malfunction of the processing apparatuses.

Especially in these days, the most semiconductor companies established an unmanned factory with a completely automated apparatus system in order to prevent the contamination caused by the personnel or staffs and to increase the productivity of the semiconductor devices. Thus, if a wafer misalignment, a wafer deformity caused by a temperature variation, a wafer mis-transfer, and the process malfunction in the chamber occur during the process, these faults may be repeated because they are not detected early in the process. Further, these faults result in the loss of materials and the waste of cost.

SUMMARY OF THE INVENTION

Accordingly, the present invention is directed to a semiconductor manufacturing apparatus that substantially overcomes one or more of the problems due to limitations and disadvantages of the related art.

To overcome the problems described above, the present invention provides a processing chamber module that is equipped with a viewer port and light-emission sources to observe and detect the process of manufacturing the semiconductor devices.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a processing chamber module for use in manufacturing semiconductor devices includes a chamber having a chamber wall; a storage containing process gases and supplying the process gases into the chamber; a inflow pipe through which the process gases flow from the storage into the chamber; a outflow pipe through which residual gases are exhausted; an insulation plate dividing the chamber into a first region and a second region; a chuck in the second region at the bottom of the chamber; a wafer mounted on the chuck; a power source connected to the chuck to supply power to the chuck and to apply a bias voltage to the chuck; a plasma generator in the first region of the chamber, the plasma generator producing an electromagnetic field to covert the process gases into plasma; at least two light-emission sources located at the chamber wall, the light-emission sources lighting up the inside of the chamber; an electric power supplier supplying electric power to the light-emission sources; and a viewer port which is installed in the chamber wall and through which an observer observes the wafer and the chamber inside. The above-mentioned light-emission sources correspond in position to each other, and emit light downward. In the processing chamber described above, each of the light-emission sources includes a transparent window shaped like a felt hat, the transparent window having a crown-shaped portion in the middle, a brim in periphery and a hollow from the outside to the inside in the crown-shaped portion, wherein the transparent window is fit into a first opening formed in the chamber wall; a window cover covering and fixing the transparent widow into the first opening of the chamber wall, wherein the window cover is fastened on the chamber wall by first screws and has a second opening in the middle; a light emitter put into the hollow of the transparent window via the second opening of the window cover and connected with a connector, wherein the connector connects the light emitter to the electric power supplier for the electric power; and a fixing bracket attached on the window cover by second screws, the fixing bracket covering the second opening of the window cover, wherein the fixing bracket has a third opening that holds the connector to fix the light emitter in the hollow. Beneficially, the transparent window is made of quartz. In the processing chamber, the chamber wall includes a first step around the first opening with corresponding to the brim of the transparent window, wherein the brim of the transparent window comes in contact with the first step so that the first opening of the chamber wall is clogged with the transparent window; and a second step next to the first step around the first opening, the second step corresponding to a peripheral portion of the window cover and having first screw holes, wherein the first screws are fit into the first screw holes to tightly fasten the window cover to the chamber wall and to fit the transparent window into the first opening with choking up the first opening. The processing chamber module further includes a first O-ring interposed between the first step of the chamber wall and the brim of the transparent window; a second O-ring interposed between the transparent window and the window cover; and second screw holes in the window cover around the second opening, wherein the second screws are fit into the second screw holes to fasten the fixing bracket on the window cover. The above-mentioned viewer port includes a window viewer having a brim in periphery, the window viewer fit into a fourth opening formed in the chamber wall; and a viewer cover covering and fixing the window viewer into the fourth opening of the chamber wall, wherein the viewer cover has a fifth opening in the middle and is fastened on the chamber wall by third screws. Beneficially, the window viewer is made of quartz. The chamber wall having the fifth opening includes a third step around the fourth opening with corresponding to the brim of the window viewer, wherein the brim of the window viewer comes in contact with the third step so that the fourth opening of the chamber wall is clogged with the window viewer; and a fourth step next to the third step around the fourth opening, the fourth step corresponding to a peripheral portion of the viewer cover and having third screw holes, wherein the third screws are fit into the third screw holes to tightly fasten the viewer cover to the chamber wall and to fit the window viewer into the fourth opening with choking up the fourth opening.

Here, the processing chamber module further includes a third O-ring interposed between the third step of the chamber wall and the brim of the window viewer; and a fourth O-ring interposed between the window viewer and the viewer cover.

In order to accomplish the above advantages, in another aspect, the principles of the present invention provide an observation device installed in a chamber that is used for manufacturing semiconductor devices. The observation device includes at least two light-emission sources located at a chamber wall of the chamber, the light-emission sources lighting up the inside of the chamber; an electric power supplier supplying electric power to the light-emission sources; and a viewer port which is installed in the chamber wall and through which an observer observes the chamber inside; wherein the light-emission sources correspond in position to each other in the chamber wall, and emit light downward. Each of the light-emission sources includes a transparent window shaped like a felt hat, the transparent window having a crown-shaped portion in the middle, a brim in periphery and a hollow from the outside to the inside in the crown-shaped portion, wherein the transparent window is fit into a first opening formed in the chamber wall; a window cover covering and fixing the transparent widow into the first opening of the chamber wall, wherein the window cover is fastened on the chamber wall by first screws and has a second opening in the middle; a light emitter put into the hollow of the transparent window via the second opening of the window cover and connected with a connector, wherein the connector connects the light emitter to the electric power supplier for the electric power; and a fixing bracket attached on the window cover by second screws, the fixing bracket covering the second opening of the window cover, wherein the fixing bracket has a third opening that holds the connector to fix the light emitter in the hollow. Beneficially, the transparent window is made of quartz. In the above observation device, the chamber wall includes a first step around the first opening with corresponding to the brim of the transparent window, wherein the brim of the transparent window comes in contact with the first step so that the first opening of the chamber wall is clogged with the transparent window; and a second step next to the first step around the first opening, the second step corresponding to a peripheral portion of the window cover and having first screw holes, wherein the first screws are fit into the first screw holes to tightly fasten the window cover to the chamber wall and to fit the transparent window into the first opening with choking up the first opening. The observation device further includes a first O-ring interposed between the first step of the chamber wall and the brim of the transparent window; a second O-ring interposed between the transparent window and the window cover; and second screw holes in the window cover around the second opening, wherein the second screws are fit into the second screw holes to fasten the fixing bracket on the window cover. The viewer port includes a window viewer having a brim in periphery, the window viewer fit into a fourth opening formed in the chamber wall; and a viewer cover covering and fixing the window viewer into the fourth opening of the chamber wall, wherein the viewer cover has a fifth opening in the middle and is fastened on the chamber wall by third screws. Beneficially, the window viewer is also made of quartz. The chamber wall having the fifth opening includes a third step around the fourth opening with corresponding to the brim of the window viewer, wherein the brim of the window viewer comes in contact with the third step so that the fourth opening of the chamber wall is clogged with the window viewer; and a fourth step next to the third step around the fourth opening, the fourth step corresponding to a peripheral portion of the viewer cover and having third screw holes, wherein the third screws are fit into the third screw holes to tightly fasten the viewer cover to the chamber wall and to fit the window viewer into the fourth opening with choking up the fourth opening. The observation device further includes a third O-ring interposed between the third step of the chamber wall and the brim of the window viewer; and a fourth O-ring interposed between the window viewer and the viewer cover.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment of the invention and together with the description serve to explain the principle of the invention.

In the drawings.

DETAILED DESCRIPTION OF ILLUSTRATED EMBODIMENTS

Reference will now be made in detail to illustrated embodiment of the present invention, examples of which are shown in the accompanying drawings. Wherever possible, the same reference numbers will be used throughout the drawings to refer to the same or similar parts.

Figure 1:
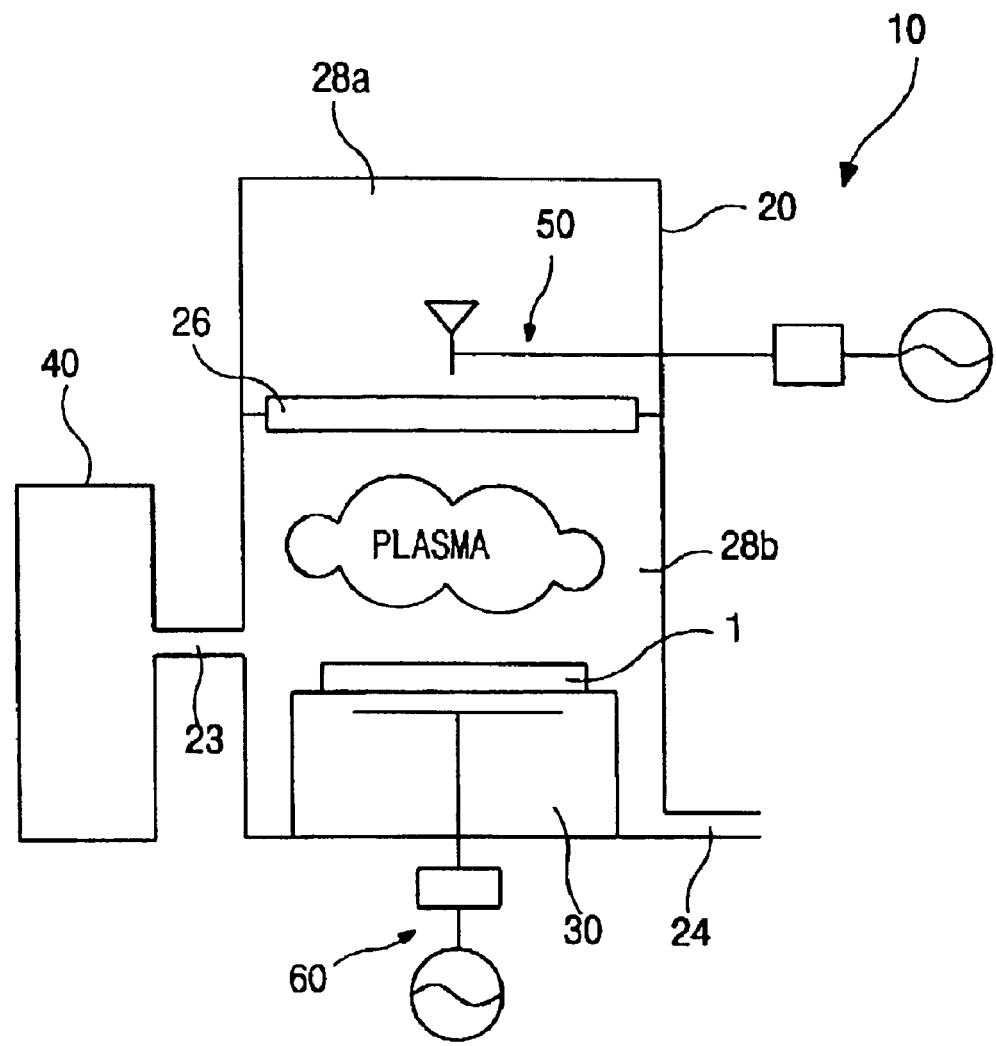
FIG. 1 schematically illustrates a processing chamber module diagram according to a conventional art.
Figure 2:
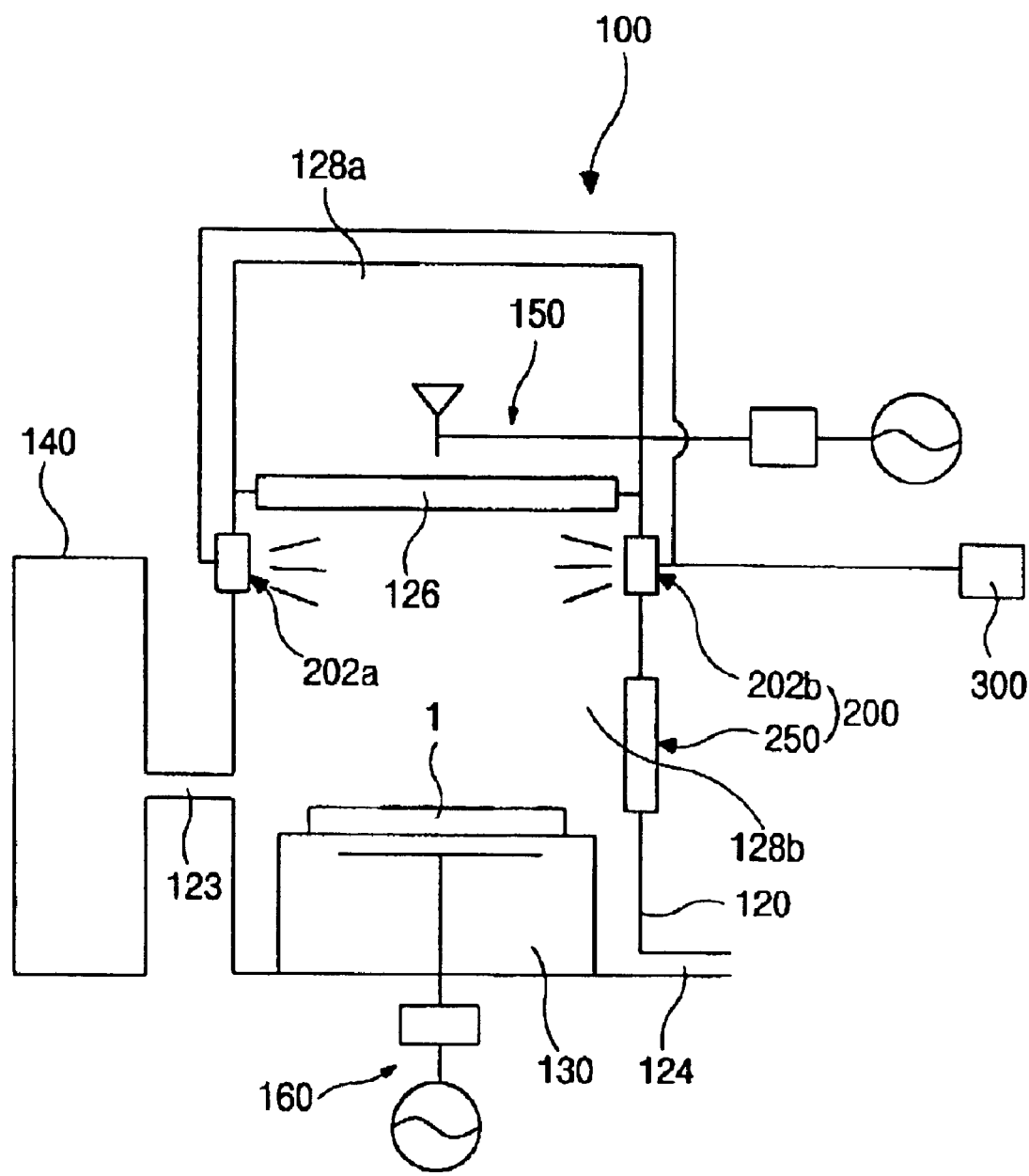
FIG. 2 schematically illustrates a processing chamber module diagram according to the present invention.

FIG. 2 schematically illustrates a processing chamber module diagram according to the present invention. As shown in FIG. 2, a processing chamber module 100 includes a chamber 120 and a storage 140. The chamber 120 is airtight isolated from the outside atmosphere, and includes a wafer 1 inside. Also, the chamber 120 performs forming, etching and patterning a thin film on the wafer 1. The storage 140 is connected with the chamber 120 through an inflow pipe 123. The storage 140 contains source materials and chemical reactants and supplies them into the chamber 120 through the inflow pipe 123 during the processes.

Still referring to FIG. 2, the wafer 1 is mounted on a chuck 130 (e.g., an electrostatic chuck) which is located at the bottom of the chamber 120. As described above, the chamber 120 includes the inflow pipe 123 through which the source materials and chemical reactants contained in the storage 140 is supplied into the chamber 120. Moreover, the chamber 120 includes an outflow pipe 124, so residual gases after the desired process are exhausted to control the pressure of the chamber 120. An insulating plate 126 is located in an upper part of the chamber 120, and then divides the chamber 120 into a first region 128a and a second region 128b. In the first region 128a, a plasma generator 150 is installed to produce the plasma in the second region 128b. The chuck 130 on which the wafer 1 is laid is located in the second region 128b.

Operating the processing chamber module 100 will be explained herein below. First, the wafer 1 is position on the chuck 130 and then the chamber 120 is made airtight. Thereafter, the source materials and chemical reactants are streamed from the storage 140 into the chamber 120 via the inflow pipe 123. The plasma generator 150 then generates an electromagnetic field so that the gases flowing from to storage 140 are converted into the plasmas in the second region 128a. The plasma produced in the second region 128 is then applied in the wafer 1 for the desired process. Further, with controlling an impact intensity o the plasma ions, connected to the chuck 130 is a power source 160 for supplying power to attract the wafer 1 to the chuck 130 and for applying a bias voltage to the chuck 130 as like the conventional art.

Unlike the conventional art, in the processing chamber module 100 of the present invention, the chamber 120 includes an observation device 200 consisting of light-emission sources 202a and 202b and a viewer port 250. The observation device 200 is especially positioned in the second region 128b of the chamber 120. The light-emission sources 202a and 202b and the viewer port 250 are in the wall of the chamber 120. The light-emission sources 202a and 202b correspond to each other in the side wall of the chamber 120, and emit light downward to light up the inside of the chamber 120. Connected to the light-emission sources 202a and 202b is an electric power supplier 300 for supplying electric power to the light-emission sources 202a and 202b. Although only two light-emission sources 202a and 202b are shown in FIG. 2, it is possible for the chamber 120 to have more than two light-emission sources. The viewer port 250 is also in the side wall of the chamber 120 to observe the wafer 1 on the chuck 130. Beneficially, the viewer port 250 is positioned in the lower part of the chamber wall than the light-emission sources 202a and 202b. Further, the light-emission sources 202a and 202b have the same shape and configuration.

Figure 3A:
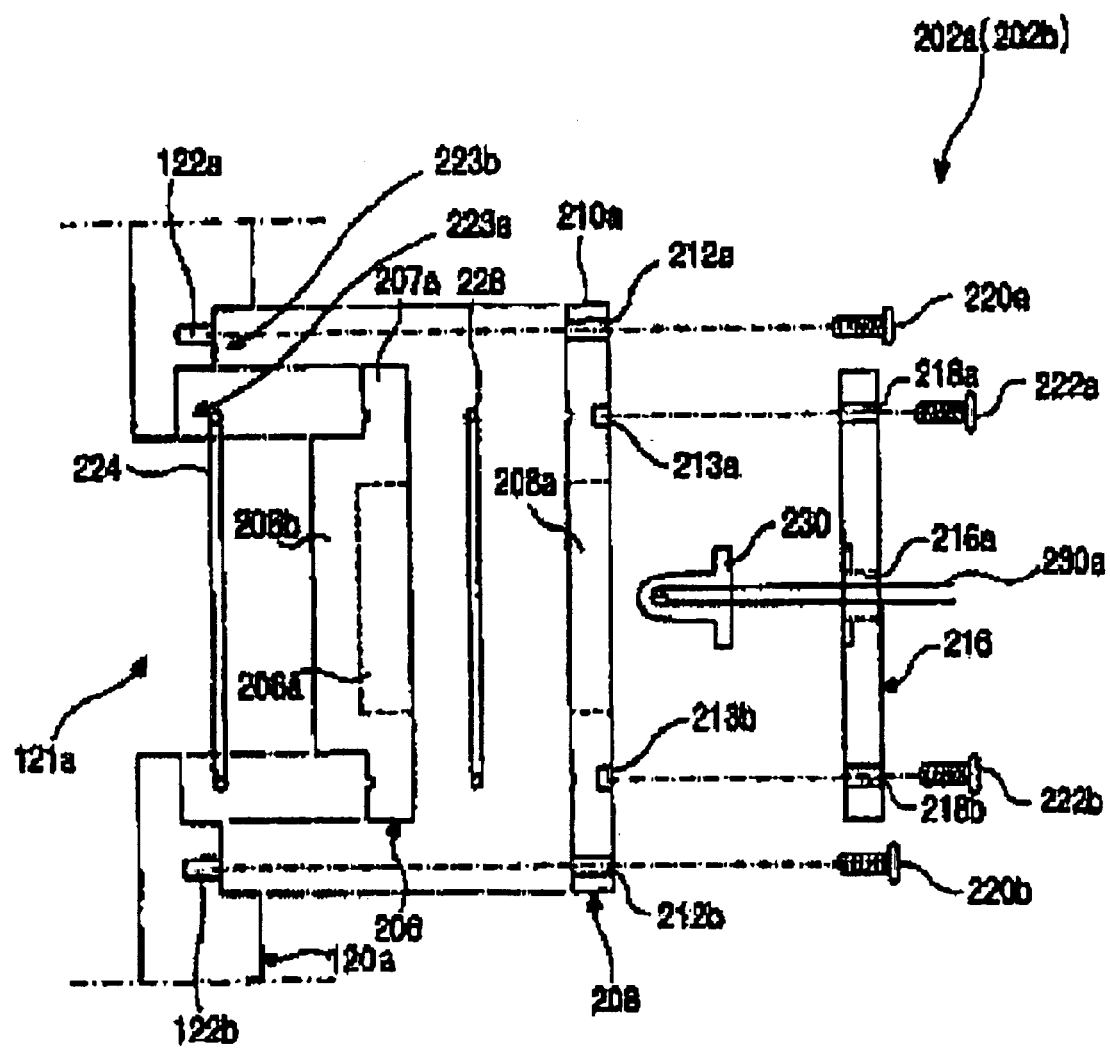
FIG. 3A illustrates a cross sectional and exploded connection diagram of a light-emission source according to the present invention.

FIG. 3A illustrates a cross sectional and exploded connection diagram of a light-emission source according to the present invention. The light-emission source 202a (or 202b) includes a transparent window 206, a window cover 208 and a fixing bracket 216. A chamber wall 120a has a first opening 121a, and the transparent window 206 is put into the first opening 121a. The window cover 208 has a second opening 208a, and fastens the transparent window 206 to the chamber wall 120a. Between the window cover 208 and the fixing bracket 216, a light emitter 230 is located so that it is fixed in the transparent window 206 when the fixing bracket 216 is attached to the window cover 208.

Still referring to FIG. 3A, the transparent window 206 is shaped like a felt hat and has a hollow 206a from the outside to the inside. As described above, the chamber wall 120a that is the side wall of the chamber 120 of FIG. 2 has the first opening 121a, so that a crown-shaped portion 206b of the hat-shaped transparent widow 206 is put and fixed into the first opening 121a. Namely, the hat-shaped transparent window 206 seals the chamber wall 120a. As a material for the transparent window 206, beneficially used is quartz that has a very good thermal-resistance. If synthetic resins, glass, or other transparent materials is used for the transparent window 206, it will be damaged by a high temperature of the chamber or it will act as impurities during the plasma process in the chamber.

In the meantime, the window cover 208 is tightly fastened onto the chamber wall 120a and makes the transparent window 206 fixed into the chamber wall 120a. The window cover 208 covers the whole transparent window 206, and has a second opening 208a in the middle so that the light emitter 230 can be installed into the hollow 206a through the second opening 208a. The light emitter 230 is an electro luminescent diode or an infrared lamp, for example. On the window cover 208, the fixing bracket 216 is attached to fasten the light emitter 230.

Around the first opening 121a, a first step 223a is formed corresponding to a brim 207a of the hat-shaped transparent window 206. The brim 207a comes in contact with the first step 223a so that the first opening 121a in the chamber wall 120a is clogged with the transparent window 208. Next to the first step 223a, a second step 223b is formed around the first opening 121a. The second step 223b corresponds to a peripheral portion 210a of the window cover 208, so the window cover 208 makes the transparent window 206 tight fit into the chamber wall 120a with choking up the first opening 121a when the window cover 208 is fastened into the chamber wall 120a by first screw 220a and 220b.

As shown in FIG. 3A, the transparent window 206, the window cover 208 and the fixing bracket 216 are attached and fixed in the chamber wall 120a by a plurality of screws. The first screws 220a and 220b penetrates first holes 212a and 212b that are formed in the peripheral portion 210a of the window cover 208, and then are fit into first screw holes 122a and 122b, respectively, which are formed in the second step 223b of the chamber wall 120a. The first screws 220a and 220b firmly fasten both the window cover 208 and the transparent window 206. Second screws 222a and 222b thread through second holes 218a and 218b formed in the fixing bracket 216, and then are fit into second screw holes 213a and 213b, respectively, which are formed in the window cover 208 around the second opening 208a. The second screws 222a and 222b fasten the fixing bracket 216 on the window cover 208.

As described above, the chamber wall 120a has the first screw holes 122a and 122b in the second step 223b, and the window cover 208 has the first holes 212a and 212b in the periphery with corresponding to the first screw holes 122a and 122b, respectively. The window cover 208 has the second screw holes 213a and 213b around the second opening 208a, and the fixing bracket 216 has second holes 218a and 218b corresponding to the second screw holes 213a and 213b. Therefore, the first screws 220a and 220b are fixed into the first screw holes 213a and 213b, respectively. Also, the second screws 220a and 220b are fixed into the second screw holes 213a and 213b through the second hole 218a and 218b, respectively. Although there are only two first screws in FIG. 3A, the number of the first screws in not limited (they can be more than two) with the correspondent holes.

In the meantime, the light emitter 230 is connected with the electric power supplier 300 of FIG. 2 for receiving the electric power. A connector 230a, for example, an electric cable, connects the light emitter 230 to the electric power supplier 300. For this connection, the fixing bracket 216 has a third opening 216a in the middle thereof, so the connector 230a can pass through the third opening 216a. In the present invention, the third opening 216a tightly holds the connector 230a so as to fix the light emitter 230 into the hollow 206a of the transparent window 206. The third opening 206a is as small as the connector 230a just threads and covers the second opening 208a of the window cover 208, thus most of the light emitted from the light emitter 230 can light up the inside of the chamber.

Moreover, a first O-ring 224 is interposed between the first step 223a of the chamber wall 120a and the brim 207a of the transparent window 206, and a second O-ring 226 is interposed between the transparent window 206 and the window cover 208. These first and second O-rings 224 and 226 reduce and prevent friction between the chamber wall 120a and the transparent window 206 and between the transparent window 206 and the window cover 208, respectively.

Figure 3B:
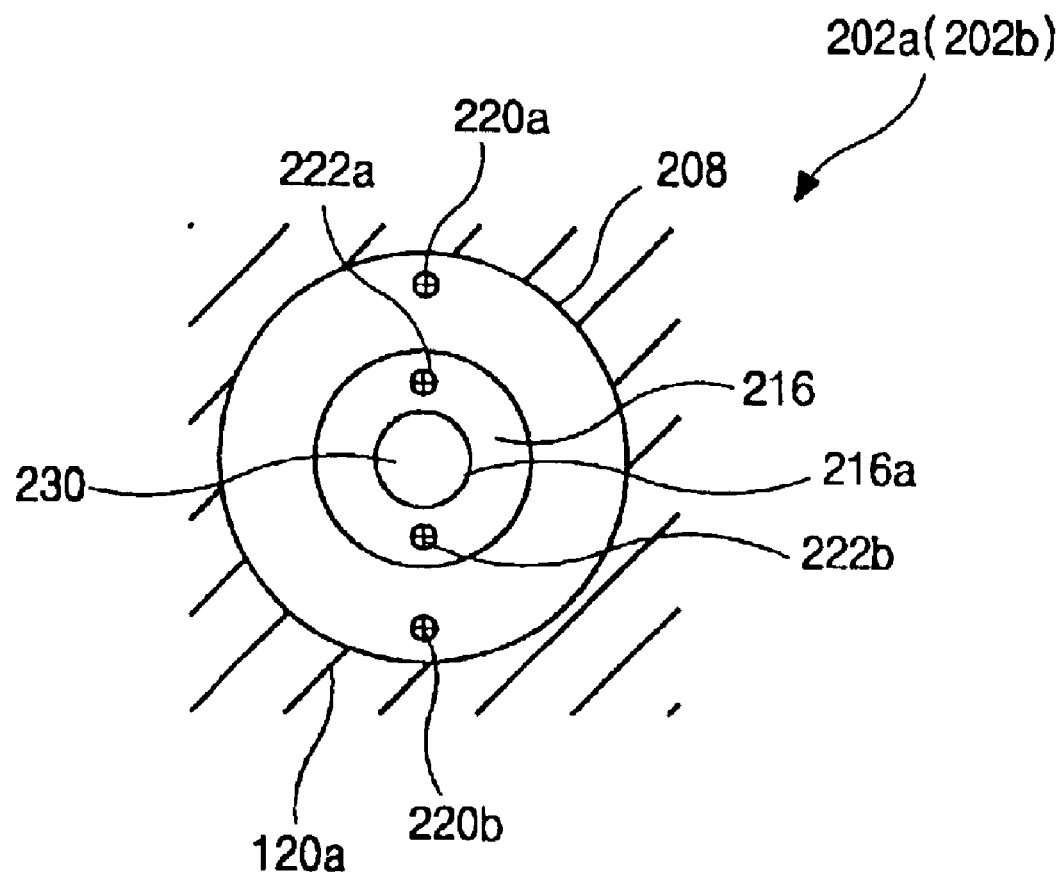
FIG. 3B is a plan view of the light-emission source according to the present invention.

FIG. 3B is a plan view of the light-emission source according to the present invention. As shown in FIG. 3B, the window cover 208 having a donut shape is located on the chamber wall 120a and fastened by the first screws 220a and 220b. The fixing bracket 216 also has the donut shape and is positioned on the window cover 208. The fixing bracket 216 is fastened on the window cover 208 by the second screws 222a and 222b. In the center of the fixing bracket 216, the light emitter 230 is shown through the third opening 216a. Although not shown in FIG. 3B, the transparent window 206 of FIG. 3A is positioned under the window cover 208.

The light-emission sources 202a and 202b illustrated in FIGS. 3A and 3B are installed in the side-wall of the chamber 120 as shown in FIG. 2. The light-emission sources 202a and 202b correspond in position to each other. The first light-emission source 202a is positioned in opposite to the second light-emission source 202b in the chamber wall. These light-emission sources 202a and 202b light up the inside of the chamber 120 from up to down. Therefore, the wafer 1 inside the chamber 120 is easily observed using the viewer port 250 that is positioned in the chamber wall below one of the light-emission sources 202a and 202b. The configuration and structure of the viewer port 250 will be explained in detail with reference to FIGS. 4A and 4B.

Figure 4A:
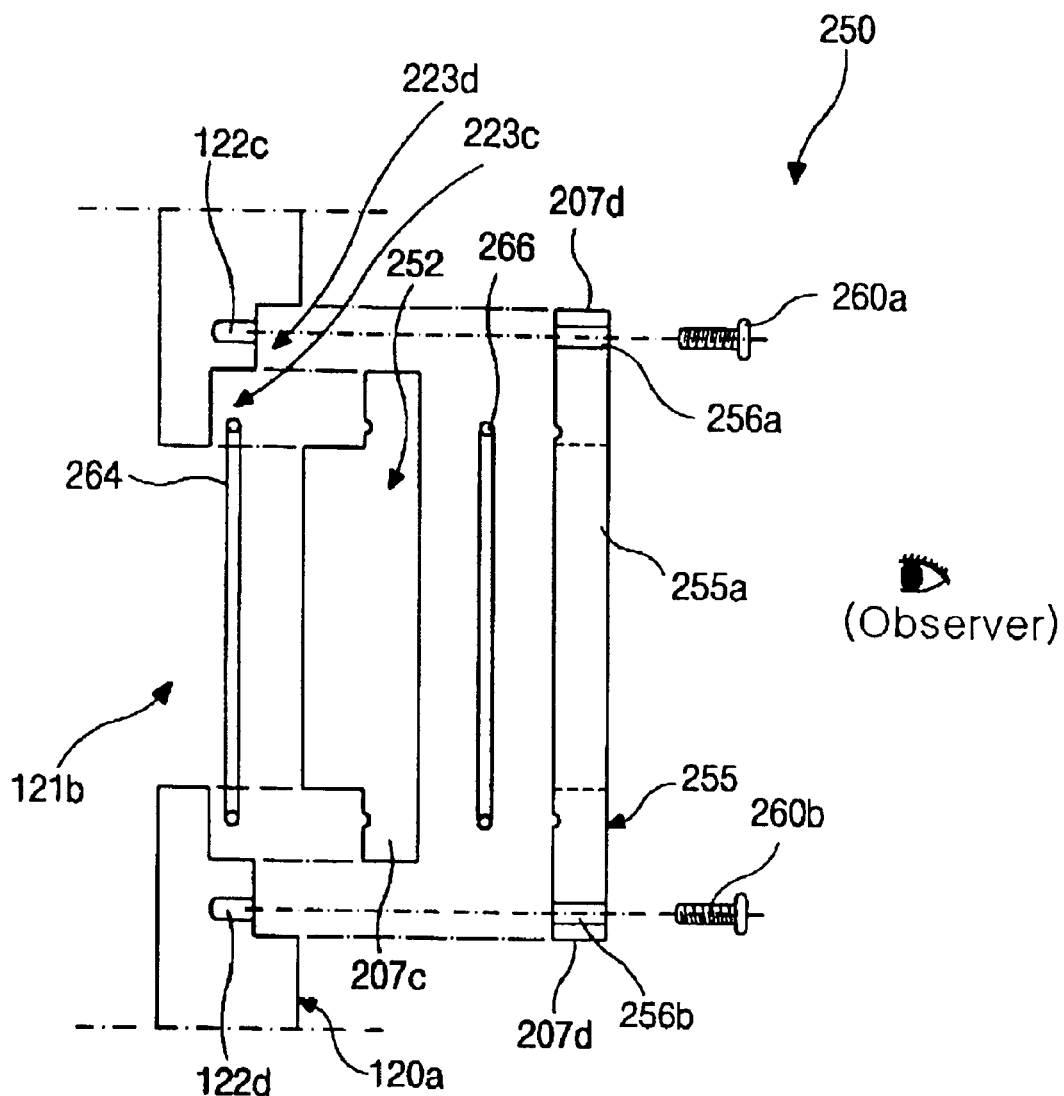
FIG. 4A illustrates a cross sectional and exploded connection diagram of a viewer port according to the present invention.

FIG. 4A illustrates a cross sectional and exploded connection diagram of a viewer port according to the present invention. The viewer port 250 includes a window viewer 252 and a viewer cover 255. The chamber wall 120a has a fourth opening 121b therein, and the window viewer 252 corresponds to the fourth opening 121b. The viewer cover 255 has a fifth opening 255a and is attached to the chamber wall 120a to cover the window viewer 252. Through the window viewer 252, the observers or other users can observe and inspect the inside of the chamber 120, especially the second region 128b of FIG. 2. As a material for the window viewer 252, quartz is used as like the transparent window 206 of FIG. 3A.

Still referring to FIG. 4A, a third step 223c is formed around the fourth opening 121b corresponding to a brim 207c of the window viewer 252. Next to the third step 223c, a fourth step 223d is formed corresponding to a peripheral portion 207d of the viewer cover 255. The chamber wall 120a has third screw holes 122c and 122d in the fourth step 223d, and the viewer cover 255 has third holes 256a and 256b. The third holes 256a and 256b corresponds to the third screw holes 122c and 122d, respectively. Therefore, third screws 260a and 260b are fit into the third screw holes 122c and 122d through the third holes 256a and 256b, respectively, for tightly attaching the viewer cover 255 to the chamber wall 120a.

In order to protect the window viewer 252 made of the quartz, a third a-ring 264 is interposed between the third step 223c of the chamber wall 120a and the brim 207c of the window viewer 252. Also, a fourth O-ring 266 is interposed between the window viewer 252 and the viewer cover 255.

Using the viewer port 250 illustrated with reference to FIG. 4A, the observers and the users can observe and inspect the inside of the chamber. Specially when the inside of the chamber 120 is dark before, after or during the process, the light-emission sources 202a and 202b are turned on to light up the second region 128b of the chamber 120 for easily observing the chamber 120 inside.

Figure 4B:
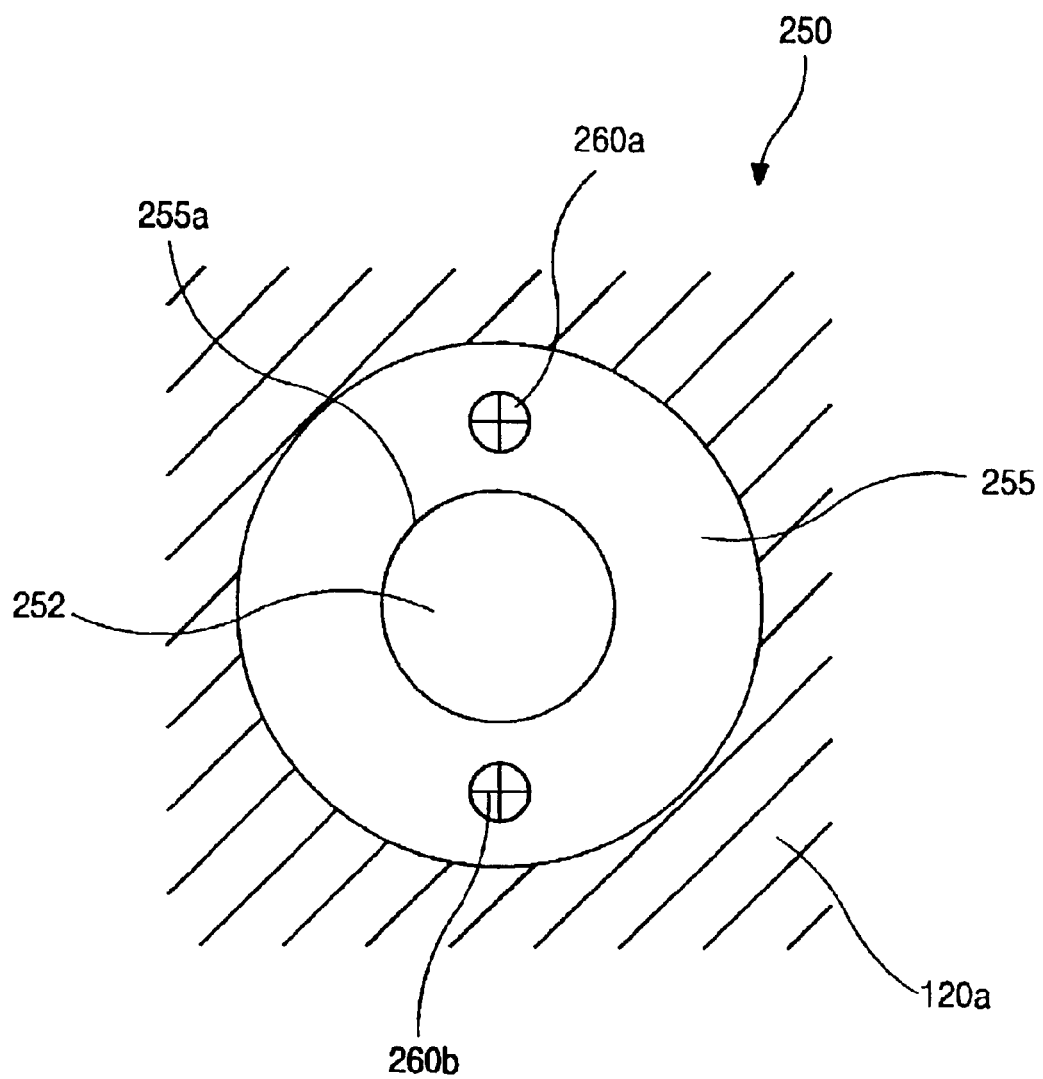
FIG. 4B is a plan view of the viewer port according to the present invention.

FIG. 4B is a plan view of the viewer port according to the present invention. As shown in FIG. 4B, the viewer cover 255 is fastened on the chamber wall 120a by the third screws 260a and 260b. The window viewer 252 is positioned below the viewer cover 255 and shown through the fifth opening 255a. Since the window viewer 252 is made of the transparent quartz, the observers and the users can watch the inside of the chamber throughout the window viewer 252.

In the present invention, since the chamber includes the observation device consisting of the light-emission sources and the viewer port, the workers can easily observe the processes performing in the chamber inside. Therefore, although the wafer is misaligned, deformed by a temperature variation, or mis-transferred, the workers can easily detect these faults and then deal with the problems. Further, if the process malfunction in the chamber occur during the process, the workers can solve the problem immediately. Additionally, since the transparent window and the window viewer are made of the quartz that does not affect the processes, any impurities and contamination do not occur in the chamber inside.

It will be apparent to those skilled in the art that various modifications and variations can be made in the capacitor and the manufacturing method thereof of the present invention without departing from the spirit or scope of the inventions. Thus, it is intended that the present invention cover the modifications and variations of this invention provided they come within the scope of the appended claims and their equivalents.

What is claimed is:

1. A processing chamber module for use in manufacturing semiconductor devices, comprising:
   a chamber having a chamber wall;
   a storage containing process gases an supplying the process gases into the chamber;
   an inflow pipe through which the process gases flow from the storage into the chamber;
   an outflow pipe through which residual gases are exhausted;
   an insulation plate dividing the chamber into a first region and a second region;
   a chuck in the second region at the bottom of the chamber;
   a wafer mounted on the chuck;
   a power source connected to the chuck to supply power to the chuck and to apply a bias voltage to the chuck;
   a plasma generator in the first region of the chamber, the plasma generator producing an electromagnetic field to covert the process gase into plasma;
   at least two light-emission sources located at the chamber wall, the light-emission sources lighting up the inside of the chamber, wherein each of the light-emission sources includes a transparent window shaped like a felt hat, the transparent window having a crown-shaped portion in the middle, a brim in periphery and a hollow from the outside to the inside in the crown-shaped portion, wherein the transparent window is fit into a first opening formed in the chamber wall, a window cover covering and fixing the transparent widow into the first opening of the chamber wall, wherein the window cover is fastened on the chamber wall by first screws and has a second opening in the middle;
   a light emitter put into the hollow of the transparent window via the second opening of the window cover and connected with a connector, wherein the connector connects the light emitter to the electric power supplier for the electric power; and
   a fixing bracket attached on the window cover by second screws, the fixing bracket covering the second opening of the window cover, wherein the fixing bracket has a third opening that holds the connector to fix the light emitter in the hollow;
   an electric power supplier supplying electric power to the light-emission sources; and
   a viewer port which is installed in the chamber wall and through which an observer observes the wafer and the chamber inside.

2. The processing chamber module of claim 1, wherein the light-emission sources correspond in position to each other, and emit light downward.

3. The processing chamber module of claim 1, wherein the transparent window is made of quartz.

4. The processing chamber module of claim 1, wherein the chamber wall comprises:
   a first step around the first opening with corresponding to the brim of the transparent window, wherein the brim of the transparent window comes in contact with the first step so that the first opening of the chamber wall is clogged with the transparent window; and
   a second step next to the first step around the first opening, the second step corresponding to a peripheral portion of the window cover and having first screw holes, wherein the first screws are fit into the first screw holes to tightly fasten the window cover to the chamber wall and to fit the transparent window into the first opening with choking up the first opening.

5. The processing chamber module of claim 4, further comprising:
   a first O-ring interposed between the first step of the chamber wall and the brim of the transparent window;
   a second a-ring interposed between th transparent window and the window cover, and
   second screw holes in the window cover around the second opening, wherein the second screws are fit into the second screw hole to fasten the fixing bracket on the window cover.

6. The processing chamber module of claim 1, wherein the viewer port comprises:
   a window viewer having a brim in periphery, the window viewer fit into a fourth opening formed in the chamber wall; and
   a viewer cover covering and fixing the window viewer into the fourth opening of the chamber wall, wherein the viewer cover has a fifth opening in the middle and is fastened on the chamber wall by third screws.

7. The processing chamber module of claim 6, wherein the window viewer is made of quartz.

8. The processing chamber module of claim 6, wherein the chamber wall having the fifth opening comprises:
   a third step around the fourth opening with corresponding to the brim of the window viewer, wherein the brim of the window viewer come in contact with the third step so that the fourth opening of the chamber wall is clogged with the window viewer; and a fourth step next to the third step around the fourth opening, the fourth step corresponding to a peripheral portion of the viewer cover and having third screw holes, wherein the third screws are fit into the third screw holes to tightly fasten the viewer cover to the chamber wall an to fit the window viewer into the fourth opening with choking up the fourth opening.

9. The processing chamber module of claim 8, further comprising:

a third O-ring interposed between the third step of the chamber wall and the brim of the window viewer; and a fourth O-ring interposed between the window viewer and the viewer cover.

10. An observation device installed in a chamber that is used for manufacturing semiconductor devices, the device comprising:

at least two light-emission sources located at a chamber wall of the chamber, the light-emission sources lighting up the inside of the chamber;

an electric power supplier supplying electric power to the light-emission sources; and a viewer port which is installed in the chamber wall and though which an observer observes the chamber inside;

wherein the light-emission sources correspond in position to each other in the chamber wall, and emit light downwards, wherein each of the light-emission sources includes a transparent window shaped like a felt hat, the transparent window having a crown-shaped portion in the middle, a brim in periphery and a hollow from the outside to the inside in the crown-shaped portion, wherein the transparent window is fit into a first opening formed in the chamber wall, a window cover covering and fixing the transparent widow into the first opening of the chamber wall, wherein the window cover is fastened on the chamber wall by first screws and has a second opening in the middle;

a light emitter put into the hollow of the transparent window via the second opening of the window cover and connected with a connector, wherein the connector connects the light emitter to the electric power supplier for the electric power; and a fixing bracket attached on the window cover by second screws, the fixing bracket covering the second opening of the window cover, wherein the fixing bracket has a third opening that holds the connector to fix the light emitter in the hollow.

11. The device of claim 10, wherein the transparent window is made of quartz.

12. The device of claim 10, wherein the chamber wall comprises:

a first step around the first opening with responding to the brim of the transparent window, wherein the brim of the transparent window comes in contact with the first step so that the first opening of the chamber wall is clogged with the transparent window; and a second step next to the first step around the first opening, the second step corresponding to a peripheral portion of the window cover and having first screw holes, wherein the first screws are fit into the first screw holes to tightly fasten the window cover to the chamber wall and to fit the transparent window into the first opening with choking up the first opening.

13. The device of claim 12, further comprising:

a first a-ring interposed between the first step of the chamber wall and the brim of the transparent window;

a second a-ring interposed between th transparent window and the window cover; and second screw holes in the window cover around the second opening, wherein the second screws are fit into the second screw hole to fasten the fixing bracket on the window cover.

14. The device of claim 10, wherein the viewer port comprises:

a window viewer having a brim in periphery, the window viewer fit into a fourth opening formed in the chamber wall; and a viewer cover covering and fixing the window viewer into the fourth opening of the chamber wall, wherein the viewer cover has a fifth opening in the middle and is fastened on the chamber wall by third screws.

15. The device of claim 14, wherein the window is made of quartz.

16. The device of claim 14, wherein the chamber wall having the fifth opening comprises:

a third step around the fourth opening with corresponding the brim of the window viewer, wherein the brim of the window viewer comes in contact with the third step so that the fourth opening fit the chamber wall is clogged with the window viewer; and a fourth step next to the third step around the fourth opening, the fourth step corresponding to a peripheral portion of the viewer cover and having third screw holes, wherein the third screws are fit into the third screw holes to tightly fasten the viewer cover to the chamber wall an to fit the window viewer into the fourth opening with choking up the fourth opening.

17. The device of claim 16, further comprising:

a third O-ring interposed between the third step of the chamber wall and the brim of the window viewer; and a fourth O-ring interposed between the window viewer and the viewer cover.

* * * * *